United States Patent [19]

Jester et al.

[11] 4,333,102

[45] Jun. 1, 1982

[54] HIGH PERFORMANCE SEMICONDUCTOR COMPONENT WITH HEAT DISSIPATING DISCS CONNECTED BY BRUSHLIKE BUNDLES OF WIRES

[75] Inventors: Alfred Jester, Speyer; Elmar Mueller, Alzey; Hubert Holick, Lampertheim, all of Fed. Rep. of Germany

[73] Assignee: BBC Brown, Boveri & Company, Limited, Baden, Switzerland

[21] Appl. No.: 104,890

[22] Filed: Dec. 18, 1979

[30] Foreign Application Priority Data

Dec. 22, 1978 [DE] Fed. Rep. of Germany ....... 2855493

[51] Int. Cl.³ .................. H01L 23/48; H01L 29/40; H01L 23/02
[52] U.S. Cl. ........................... 357/81; 357/79; 357/65; 357/68
[58] Field of Search ................ 357/65, 68, 17, 81, 357/79

[56] References Cited

U.S. PATENT DOCUMENTS

| | | | |
|---|---|---|---|
| 2,906,930 | 9/1959 | Raithel | 357/65 |
| 3,273,029 | 9/1966 | Ross | 357/68 |
| 3,295,089 | 12/1966 | Moore | 357/81 |
| 3,387,191 | 6/1968 | Fishman et al. | 357/81 |
| 3,675,089 | 7/1972 | Hantusch et al. | 357/81 |
| 3,969,754 | 7/1976 | Kuniya et al. | 357/81 |
| 4,067,104 | 1/1978 | Tracy | 357/17 |

*Primary Examiner*—Andrew J. James
*Attorney, Agent, or Firm*—Oblon, Fisher, Spivak, McClelland & Maier

[57] ABSTRACT

On the two main surfaces of a semiconductor disc of a large diameter, high-performance semiconductor component, there are soldered one bundle each of metal wires. The other ends of the metal wires are soldered to heat dissipating discs. The metal wires, with increasing distance from the center, are of increasing lengths in order to absorb the differences in the thermal expansion of the semiconductor disc and the heat dissipating discs. Metal ring portions and a ceramic housing complete the semiconductorcomponent. A secure and desirable contact of the semiconductor discs is achieved without the application of pressure.

7 Claims, 9 Drawing Figures

HIGH PERFORMANCE SEMICONDUCTOR COMPONENT WITH HEAT DISSIPATING DISCS CONNECTED BY BRUSHLIKE BUNDLES OF WIRES

BACKGROUND OF THE INVENTION

1. Field of the Invention

This invention relates to a high-performance semiconductor component with a disc-shaped body, having at least one pn-junction, with thermically and electrically conductive heat dissipation discs, in the main current and thermal paths, soldered to the corresponding contact surfaces of the semiconductor body by way of equally thermically and electrically conductive disc-shaped metal contacts, and with an insulating housing surrounding the disc rim of the semiconductor disc.

2. Description of the Prior Art

A high-performance semiconductor component of this type may be used as an individual element, or it may be integrated into a high-performance semiconductor module for the assembly of rectifier circuits. The term "high-performance semiconductor-module", here, is to be understood to mean an element with one or several, preferably, however, two semiconductor elements fastened to a common mounting plate, in the form of tablets provided with electrodes, insulated or passivized, respectively, along their rims, frequently not having a housing and, as an alternative, with wiring elements contained in a common housing with a cooling device, whereby the main current connections and the gate current connections, where applicable, of the semiconductor element or elements, preferably are brought out of the housing at one side only. It is known, however, that so-called disc-cells, which are high-capacity semiconductor elements with their own disc-shaped housing, may be integrated into a module (BBC-Communications 1978, pp. 200–206).

For the thermic and electrical contacting of high-performance semiconductor components, at present, mainly dotting contact technology is utilized (VDE-Book Series, Vol. 11 (1966), p. 84). The dotting contact technology may be combined with advanced solutions, as, for instance, the use of heat pipes, or of direct water cooling, with great difficulty. Also, heat elimination by way of a dotting contact must be considered to be a compromise from the beginning because of the differences in thermic expansion of the materials used. In instances of pure dotting contact technology, i.e. with contacts between all heat-transfer surfaces and the cooling elements, the insertion of ductile silver cups is of record (DE-OS No. 2 029 806). For this, and additional embodiments of dotting contact technology of record, it must be observed that two surfaces are sliding directly upon each other and that the effects of friction must be anticipated. With increasing disc diameters, dotting contact technology is reaching its limits because of the increasing absolute differences of radial expansion and the increasing difficulties of uniform distribution of pressure.

Numerous variances of pure dotting contact technology are known, which means that contacts between the semiconductor body, the metal discs and the heat dissipation plates, mostly made of copper or molybdenum, are also often designed to partially utilize close fitting material contact (i.e., DE-OS No. 1 944 081). Because of differences in thermic expansion, the size of such soldered contacts is limited.

An additional solution is of record, whereby liquid metal contacts are provided (U.S. Pat. No. 3,654,528, GB-PS No. 914 034). This technology has problems with sealing tightness, with corrosive influences of the liquid metal and difficulties with stress caused by temperature variations.

SUMMARY OF THE INVENTION

Relative to the contacting sequence, this invention is based on a structure corresponding to that of dotting contact technology. It proposes to solve the task of creating a contacting system whereby the semiconductor disc suffers litte mechanical stress during temperature variations on the one hand, and makes the connection of heat dissipation plates possible on the other.

This task is solved by making each metal contact out of a brush-like bundle of individual wires, whereby at least part of the individual wires are longer than the distance between the two metal surfaces of the metal contact.

This measure gains the advantage that the individual wires may follow a radial heat expansion, while the surfaces of the semiconductor disc and the heat dissipation disc, facing each other, nevertheless, remain parallel to each other. Thus, in the place of a molybdenum round sliding on the semiconductor disc during temperature stress, as is common for dotting contact technology, a radially elastic metal contact is used which does not need to slide and therefore may be connected with the semiconductor disc as well as with the heat dissipation disc with large contact surfaces in a fitting material contact which is stable because the tensile stress affecting the semiconductor disc has been reduced.

Preferably, each bundle is pre-twisted in relation to the geometrical center axis which is vertical to the two main surfaces of the semiconductor disc. The tensile stress otherwise occurring with large-surface soldering at the semiconductor disc, is advantageously and considerably reduced, since with the aforementioned measure, the individual wires are given a length allowance that proportionally increases with the increasing distance from the center line. In other words, the difference in radial heat expansion between the semiconductor disc and the heat dissipating discs is reduced to a largely neutral rotatory motion between the two.

Preferably, the bundle connected to one of the main surfaces of the semiconductor disc is pre-twisted in the opposite direction to the one connected to the other main surface of the semiconductor disc. By this method of pre-twisiting in opposite directions, the radial expansion differences between the dissipation discs and the semiconductor disc are translated into rotation around the central line of the semiconductor disc itself. The two dissipation discs are not put under any stress relative to their rotation against each other, so that outside cooling devices, for instance heat pipes, cooling boxes, water-bearing contact rails, may be connected without any problems, and the two heat dissipating discs may be connected in a conventional manner with the insulating housing surrounding the rim of the semiconductor disc.

It is practical to provide the bundles with a twist of about 2 rotations per 1 meter length, relative to a parallel wire bundle which has not yet been cut at right angles to its longitudinal axis.

Preferably, each bundle consists of separate smaller bundles which are pre-twisted each by themselves. This results in the advantage of obtaining a longitudinal allowance permitting a yielding in an uneven temperature profile along the radius of the semiconductor disc, particularly with maximum temperatures in the center. This means that the longitudinal allowance may be adjusted according to any desired function relative to the distance of the metal bundle contact from the center line towards the rim.

It is practical to coat the individual wires with a slip layer of carbon, anodized aluminum or enamel.

As an alternative, the interstices between the individual wires may be filled with a highly elastic filler material, preferably made of silicon caoutchouc in the form of foam.

The slip layer as well as the filler material permit a high component density while largely maintaining free mobility of the wires against each other. In this connection, it must be noted that a packing density of more than 50% wire material already presents an advantage over a solid metal round, since the bundle permits an absolutely even, closely fitting material contact with the semiconductor disc across its entire disc surface.

Various other objects, features and attendant advantages of the present invention will be more fully appreciated as the same becomes better understood from the following detailed description when considered in connection with the accompanying drawing, wherein like reference characters designate like or corresponding parts throughout the several views.

DETAILED DESCRIPTION OF THE PREFERRED EMBODIMENTS

Figure 1:
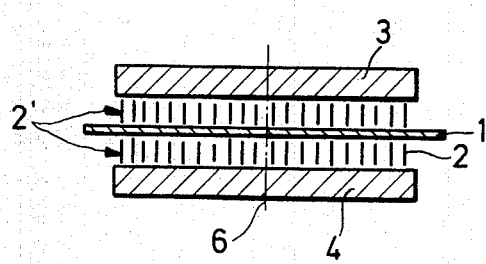
FIG. 1 illustrates a semiconductor disc which is soldered to heat dissipating discs at both sides by means of individual wires of equal length.
Figure 2A:
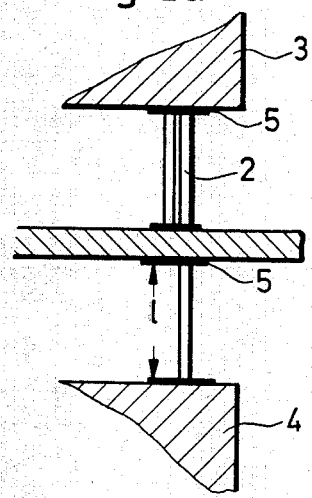
FIG. 2a shows a cross-section of FIG. 1 prior to soldering.

For a better understanding of this invention, resort should be had to an arrangement as shown in FIG. 1, wherein a silicon disc 1 is soldered to heat dissipation discs 3 and 4, made of copper, by means of two untwisted metal bundle contacts 2' which are made of individual copper wires. The individual wires 2 have one identical length l and one diameter d (FIG. 2). They are connected by means of close material contacts 5, for example solder contacts, with the silicon disc 1 as well as with the corresponding heat dissipating discs 3 and 4.

Figure 3:
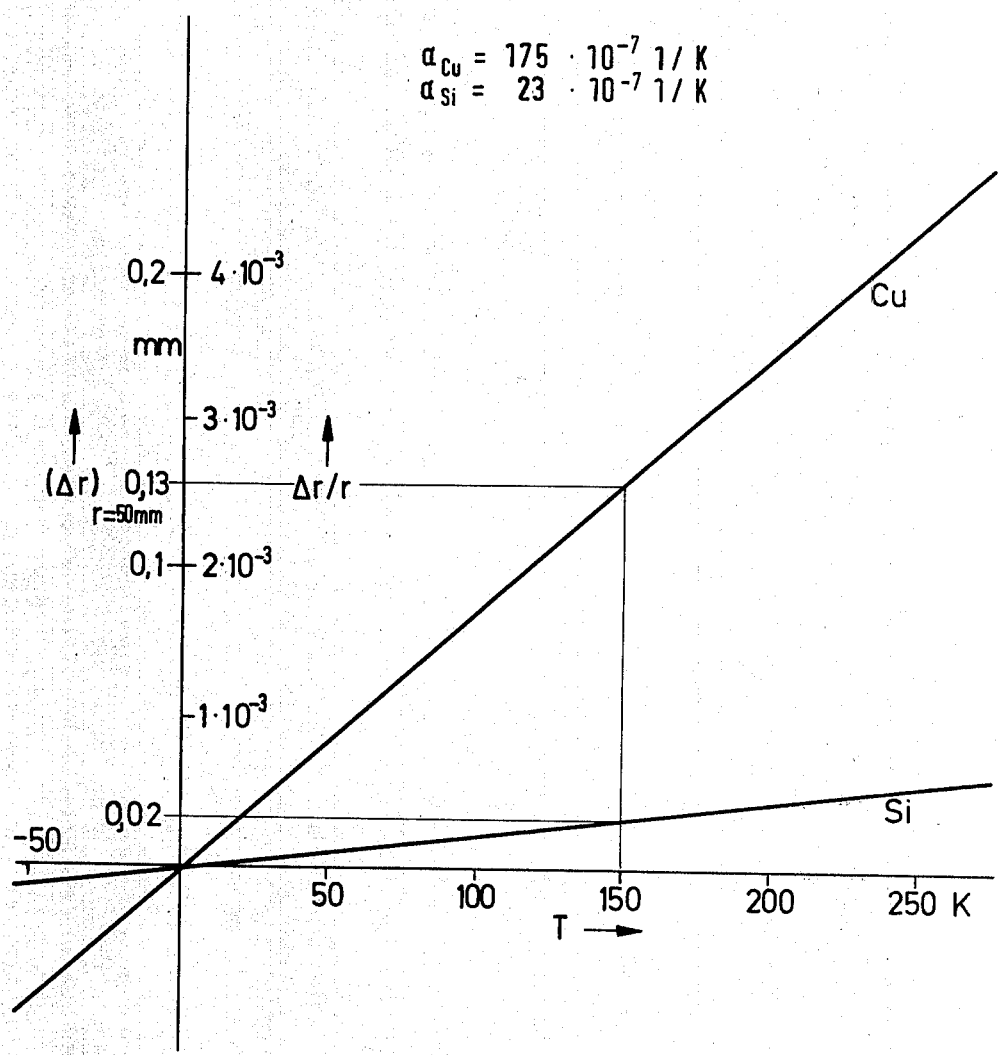
FIG. 3 is a diagram from which can be ascertained the temperature-related expansion differences of silicon and copper.

In FIG. 3, a right-angle coordinate system with the temperature difference $\Delta T$ in Kelvin on the abscissa is seen; on the right-hand ordinate scale is the relative enlargment $\Delta r/r$ of a disc with radius r, and on the left-hand scale is the absolute length change $\Delta r$ in millimeters for a disc with radius r=50 mm. For the temperature increase $\Delta T=150$ K., given as an example, a silicon disc increases in radius by 0.02 mm while a copper disc of the same radius increases its radius by 0.13 mm. The radius differential of 0.11 mm must be taken up by the connective member between the copper and silicon discs, without one of the elements concerned being mechanically destroyed or the electrical and thermal transfer being hindered in the process.

The transverse and tensile stresses which arise for this type of contacting for the silicon disc 1 are estimated below.

Figure 2B:
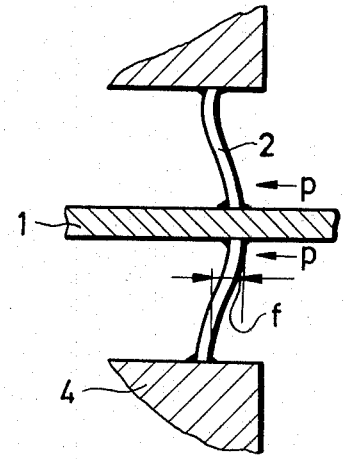
FIG. 2b shows a cross-section of FIG. 1 after soldering.
Figure 6:
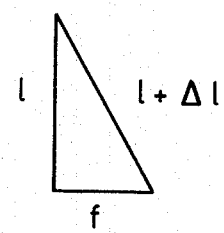
FIG. 6 is an expansion diagram pertaining to FIG. 1.

The varying radial heat expansion between heat dissipation discs 3 and 4, and silicon disc 1 results in the bundles 2' being changed in form after the hardening of the solder and cooling to room temperature, in the way depicted in FIG. 2b. The force P necessary for the excursion f is as follows:

$$P = \frac{E \cdot J}{l^3} \cdot 12 f \text{ where} \quad (1)$$

$E$ = elasticity module of the brush material, $J = \frac{\pi}{64} \cdot d^4$ = surface inertial moment of a wire with diameter $d$, $l$ = length of a bundle wire.

$$f = r \cdot \Delta\alpha \cdot \Delta T \quad (2)$$

$T$ = varying radial thermal expansion between the metallic and silicon disc with,
$r$ = distance from the center line, $\Delta\alpha$ = difference in expansion coefficients, $\Delta T$ = difference between soldering and room temperature.

When the individual wires 2 are densely packed, a transverse stress on the silicon disc 1 results:

$$\tau = \frac{P}{d^2 \cdot \pi/4} = \frac{3 \cdot E \cdot d^2 \cdot f}{4 \cdot l^3}. \quad (3)$$

Equation (2) inserted into equation (3) results in:

$$\tau = \frac{3 \cdot E \cdot d^2 \cdot \Delta\alpha \cdot \Delta T}{4 \cdot l^3} \cdot r. \quad (4)$$

Figure 4:
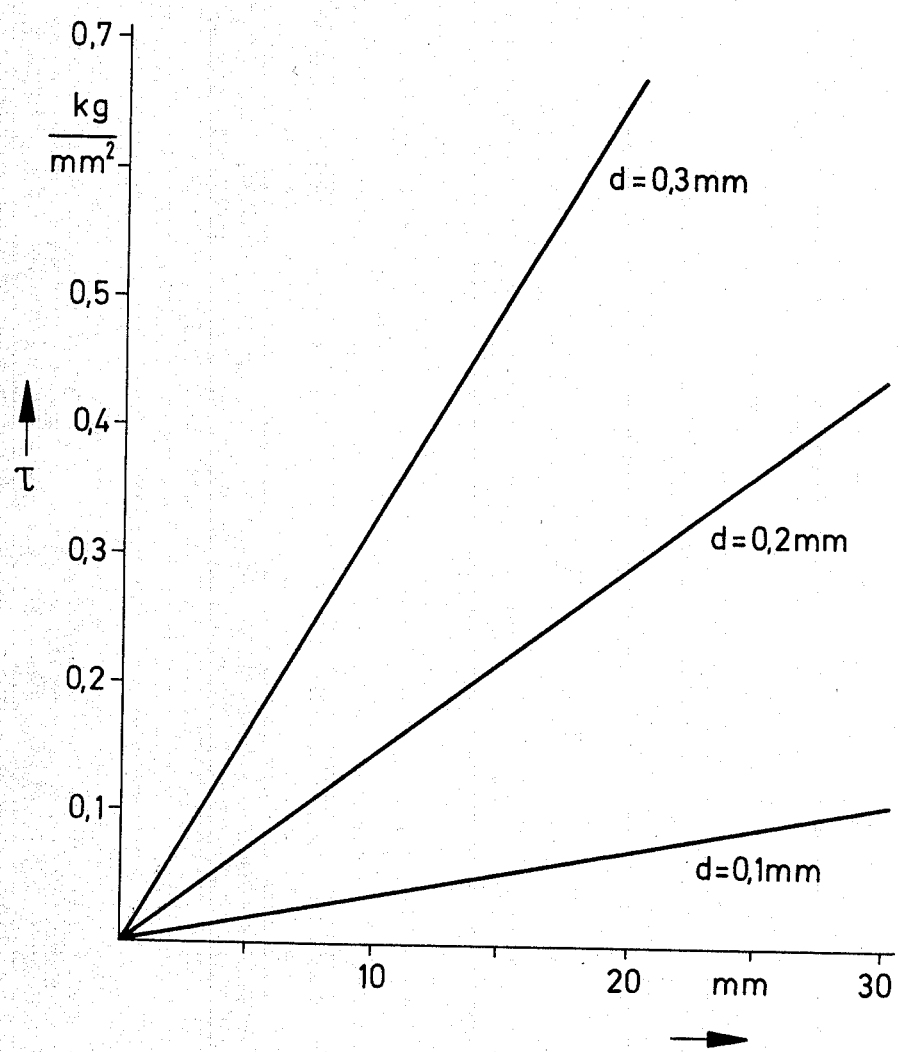
FIG. 4 shows the transverse stress at the semiconductor disc according to FIG. 1 and in dependence upon the disc radius, without twisting the wires.

The transverse stresses $\tau$ on the silicon disc 1 are denoted in FIG. 4 for various wire diameters d. It is assumed that copper is the most desirable material for the heat dissipation discs 3 and 4 and for the brush and bundle wires 2, at least with respect to application and cost. From the point of view of conductivity, silver is of course more advantageous as a wire material. Assuming infinite rigidity for the heat dissipating discs, the wires 2 experience a lengthening $\Delta l$ in addition to their radial excursion. The tensile stress $\sigma$ affecting the silicon disc results in FIG. 5.

$$\sigma = E \cdot \frac{\Delta l}{l} \quad (5)$$

$$= E\left(\sqrt{l + \left(\frac{r \cdot \Delta\alpha \cdot \Delta T}{l}\right)^2} - l\right)$$

Figure 5:
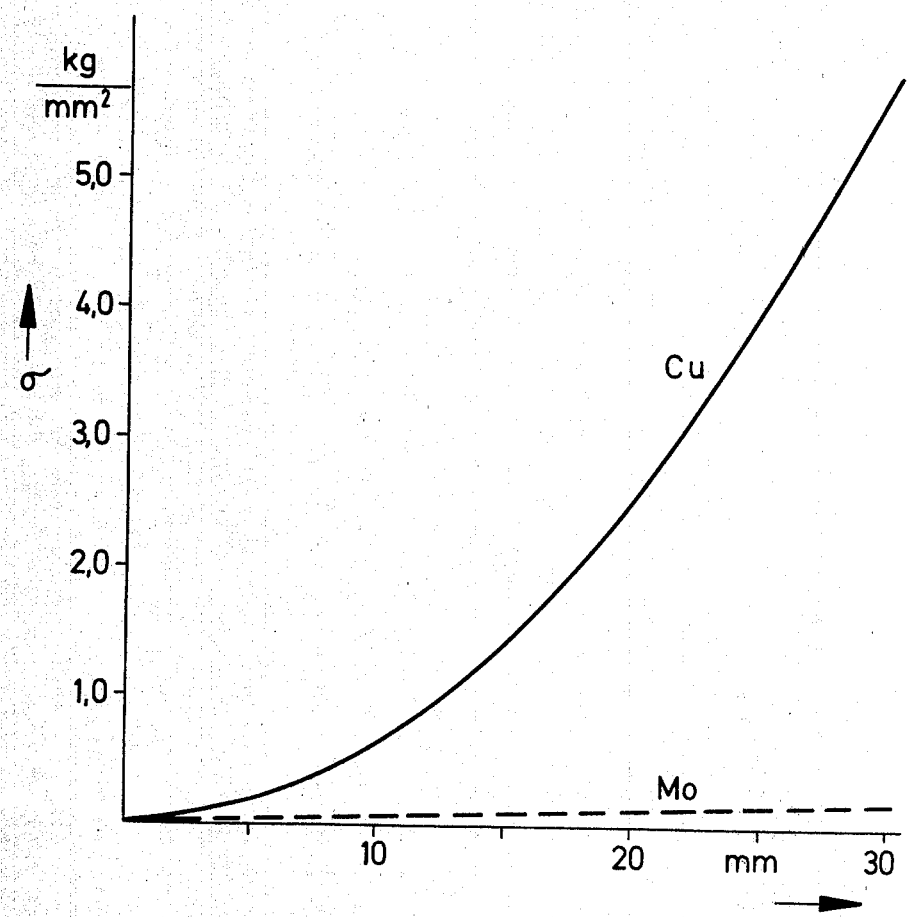
FIG. 5 illustrates the tensile stress at the semiconductor disc according to FIG. 1 and in dependence upon the disc radius.

It is recognized that this tensile stress is independent of the diameter d of the individual wires 2. If a copper disc 3 or 4 is replaced with one of molybdenum, a considerably lower tensile stress affecting the silicon disc will result (FIG. 5, dotted curve). However, this would merely shift the problems of heat expansion away from the silicon disc 1 and towards the outside, since the cooling body into which the heat is dissipated normally consists of copper or a similar material with a high thermal expansion coefficient.

If it is assumed that the copper discs 3 and 4 are supposed to remain parallel to one another during the expansion as in FIG. 1, it would be seen that because of the varying radial expansion f, with increasing distance from the center line 6, as illustrated in FIG. 5, considerable tensile stresses would affect the silicon disc 1 and destroy it.

Figure 8:
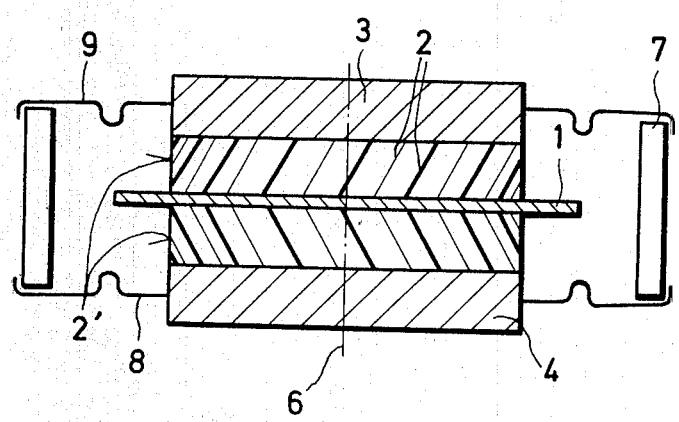
FIG. 8 shows a semiconductor diode in cross-section with contact by means of metal bundle contacts twisted in opposite directions to each other (not shown in cross-section in the drawing).
Figure 7:
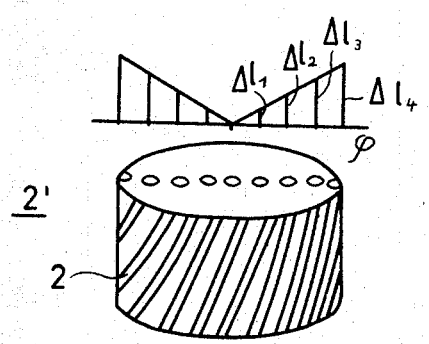
FIG. 7 is an perspective view of a pre-twisted metal bundle contact with the illustration of the length allowance corresponding to the twist angle.

As seen in FIGS. 5, 7 and 8, the individual wires 2 of the metal contact bundle 2' are accordingly given a certain length allowance with increasing distance from the center line 6 (e.g., by cutting the disc-shaped bundle 2' with parallel disc surfaces out of a pretwisted cable of parallel running wires).

FIG. 7 is an exaggerated illustration of a pre-twisted bundle 2'. Above that, the longitudinal allowances $\Delta l_1, \Delta l_2, \ldots$, which result from a twisting angle $\psi$, are listed for the individual wires 2. The relative lengthening is approximately 0.1% of the corresponding original length.

FIG. 8 uses the example of a semiconductor diode to show that the bundle 2', which is soldered to the heat dissipating disc 3, is twisted in the opposite direction to that of the bundle 2', which is soldered to the heat dissipating disc 4. The semiconductor diode of FIG. 8 has a ceramic housing 7, of conventional construction, surrounding the rim of the silicon disc. This housing is soldered to metal rings 8 and 9 made, for example, of a nickel-iron alloy, copper or iron, for axial length compensation. This ring portion 8 or 9 is simultaneously soldered to the rim of the appropriate heat dissipating disc 3 or 4 so that hermetic sealing of the interior of the interior of the semiconductor component results.

This high-performance semiconductor component, provided with the housing 7 in a conventional manner, can easily be cooled with heat pipes, air-cooled cooling bodies, liquid-cooled cooling boxes, and so on, since no pressure contact with a gripping device is required.

It is understood that two or more essentially bare arrangements of silicon tablets 1, metal bundle contacts 2' and heat dissipating discs 3 and 4 may be integrated into a common housing to form a module, whereby electrically insulated heat dissipation takes place for the main electrodes which are separated due to their charge.

The following is an explanation of the operation of the contacting in accordance with the invention during manufacture and under conditions of temperature change. If a copper heat dissipation disc 3,4 is soldered via a pretwisted bundle 2' to the silicon disc, the additional lengths of the individual wires 2, required by the increasing distance from the middle line, can be drawn from the reserve available from longitudinal allowances $\Delta l_1, \Delta l_2, \ldots$, (created by the pretwisting) during the cooling of the sandwich made of silicon disc and heat dissipation discs 3 and 4. This means that the twist previously present in bundle 2' is partially eliminated by the variations in thermal expansion, depending on the allowance given. Regarding only the silicon disc 1 and a heat dissipation disc 3 (made of copper, for example), the varying radial thermal expansion between copper and silicon is reduced to a virtually neutral rotational motion between the copper disc 3 and the silicon disc 1. The tensile stresses depicted in FIG. 5 virtually disappear. Merely the transverse stresses shown in FIG. 4 remain, and these may be kept as small as desired by means of a reduction in wire diameter. The necessary torsion angle results in a first approximation from $$\psi = \Delta\alpha \cdot \Delta T. \tag{6}$$

For a silicon-copper combination, the torsion angle $\psi$ is about 3°. Now, if the other side of the silicon disc 1 is also provided with a bundle 2', which is pre-twisted in the opposite direction, the two heat dissipating discs 3 and 4 can be held firm and can be prevented from rotating against each other. Radial expansion differences between the heat dissipating discs 3 and 4 the silicon disc 1 are absorbed by rotation of the silicon disc 1 around the center line 6 at an angle of about 3°. The same applies for temperature variation (stress) during operation.

FIGS. 7 and 8 are schematic illustrations with wires 2 at great distances from one another. Actually, a packing density as far in excess of 50% as possible is the goal for bundles 2'. In this case, the individual wires would remain mobile even though resting upon one another. This mobility, in addition to relieving the silicon disc 1 of tensile stress as described above, has the added advantage of a stable material contact with the silicon disc 1 and the pertinent heat dissipating disc 3 or 4. This results in heat elimination on the entire surface area, and the basic condition that the temperature not rise above a predetermined maximum level is fulfilled. The danger in dotting contact technology is considerably reduced now that there are contacts only in segment surface areas. The expensive manufacture of exactly planar surfaces or of surfaces which are manufactured to provide precisely matching surfaces according to function, is no longer necessary.

The mobility may, for example, be ascertained by means of a slip layer of carbon material. The coating with carbon is done in the following manner. Nitrocellulose is mixed with amyl-acetate. This mixture is used for the coating of a cable which has two twists per meter of length. The coating results in the wires being fixed in relation to each other, and they can then be sliced at right angles to the cable axis to form the disc-shaped metal bundle contacts 2'. The metal bundle contact 2' inserted between heat dissipation disc 3 or 4 and silicon disc 1 is heated in a vacuum to about 520K. As the amyl-acetate is volatile, the nitrocellulose is reduced to gaseous components and the carbon remains on the wires 2.

Other possible materials for the slip layer are anodized alumninum and enamels. Just like carbon, these substances prevent sintering of the wires 2, and they reject solder so that during the soldering of the wires 2 to the silicon disc 1 on the one hand, and to the heat dissipating discs 3, 4 on the other, no solder can enter the spaces between the wires.

A further possibility consists of moulding the wires 2, brought together to form a bundle, or smaller bundles or stranded wires 20, with a silicon caoutchouc embedding mass with closed pores. This embedding mass is able to enter the smallest cracks in the μm area, and thus the spaces between the wires 21. When cross-linked, the embedding mass is highly elastic. Its heat resistance lies at above 520K. Like the aforementioned substances, it rejects solder. It has been shown that each individual small wire with a diameter of, for example, 0.07 mm of a stranded wire 20 with a cross section of 2.0 mm² was surrounded on all sides by the embedding mass.

The advantages of this procedure consist of the following:

(1) from a package of embedded stranded wire, it is very easy to separate disc-shaped metal bundles 2';

(2) the individual wires 2 of each metal bundle 2' are positioned next to one another with full elasticity, and (3) the interstices 21 are kept free of contamination and solder during the processing and the soldering steps.

If, for instance, 137 individual bundles 20 (stranded wires) of 2.0 mm² cross section are combined into a bundle of 26 mm and are then embedded, the degree of filling or packing density amounts to about 60%. The specific heat resistance $R_{th}$ of a 5 mm thick metal bundle contact 2' is about $R_{th} = 0.25°$ C/W/cm².

As previously mentioned, all the wires 2 may be given a longitudinal allowance, independent of their distance to the center axis. This may be done in such a way that the metal bundle contact 2' is assembled from a large number of combined pre-twisted individual bundles 20 (e.g., stranded wires of 2.0 mm², and with the diameter of individual wires being 0.07 mm). As a result, each individual wire 2 of the metal bundle contact 2' has a shape resembling winding stairs. This has the following advantages:

(1) varying radial expansions of the silicon discs 1 and the heat dissipating disc 3 or 4, respectively, may be absorbed independently of the distance from the center axis, which is important, as stated at the outset, in the case of, for example, a temperature profile of the individual discs which decreases from the center outwards toward the rim: and (2) the metal bundle disc 2' also has a slight elasticity in its axial direction as opposed to that of the radial direction, which reduces the demand for accurate planar surfaces on the individual discs. This yields a considerable cost reduction for silicon discs 1 having a diameter from 50–100 mm which are used for contacting. This is not an upper limit for the contacting technique of this invention.

In order to achieve these two essential advantages, it is acceptable that the possible packing density (about 60%) is below that of the bundle described in connection with FIG. 7 (about 90%). Compared to a conventional molybdenum round, a conductivity of the metal bundle contact 2' is obtained in both cases which is increased by a factor of between 1.5 and 2. The slicing of a planar-parallel wire cable can be accomplished electro-erosively. Separation of the bundle 2' is prevented by the adhesion of the coating material and/or by an outer sleeve which may be removed subsequent to soldering.

The soldering contact between bundle 2' and the silicon disc 1 may be made with conventional gold or silver solder.

Another alternative consists of gold-plating the silicon disc 1 and the disc surface of the metal bundle 2' and thereafter welding them together under pressure and at a temperature of about 520K.

The following numerals and corresponding legends were used throughout the description of the preferred embodiments:

1 Silicon disc
2 Individual wires
2' Metal bundle contacts
3,4 Heat dissipating discs
5 Connections
7 Ceramic housing
8,9 Metal ring parts
20 Stranded wires
21 Interstices between the wires Obviously, many modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A high-performance semiconductor component with a semiconductor disc, having at least one pn-junction, with thermically and electrically conductive heat dissipating discs in the main current and thermal paths connected to the corresponding contact surfaces of said semiconductor disc by means of equally thermically and electrically conductive disc-shaped metal contacts, each metal contact consisting of a brushlike bundle of individual wires, each of said wires being coated with a suitable insulating material and bonded individually to said semiconductor disc and said heat dissipating discs, respectively, and an insulating housing surrounding the disc-rim of said semiconductor disc, wherein the improvement comprises:

each bundle is pre-twisted in relation to a geometric central axis running vertically to the main two surfaces of said semiconductor disc and at least some of said individual wires are longer than the length corresponding to the distance between the two disc surfaces of the metal contact.

2. A high-performance semiconductor component as claimed in claim 1, wherein the individual wires are coated with a slip layer of carbon.

3. A high-performance semiconductor component as claimed in claim 1, wherein one bundle of said individual wires connected to one of the main surfaces of the semiconductor disc is pre-twisted in an opposite direction to the bundle connected to the other main surface of the semiconductor disc.

4. A high-performance semiconductor component as claimed in claim 1, wherein the bundle is twisted with about two twists to a length of about 1 meter, in relation to an uncut cable of parallel wires.

5. A high-performance semiconductor component as claimed in claim 1, wherein each bundle consists of stranded wires that are individually pre-twisted.

6. A high-performance semiconductor component as claimed in claim 1, wherein interstices between the individual wires are filled with a highly elastic filler material of expanded foam.

7. A high-performance semiconductor component as claimed in claim 6, wherein the filler material consists of silicon caoutchouc.

* * * * *